US011094605B2

(12) United States Patent
    Ho

(10) Patent No.: US 11,094,605 B2
(45) Date of Patent: Aug. 17, 2021

(54) SYSTEMS AND METHODS FOR SUPPORTING A COMPONENT

(71) Applicant: Ball Aerospace & Technologies Corp., Boulder, CO (US)

(72) Inventor: Joseph Hsing-Hwa Ho, Boulder, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 0 days.

(21) Appl. No.: 16/844,217

(22) Filed: Apr. 9, 2020

(65) Prior Publication Data
    US 2020/0280154 A1    Sep. 3, 2020

Related U.S. Application Data

(63) Continuation-in-part of application No. 16/206,269, filed on Nov. 30, 2018, now Pat. No. 10,658,262.

(60) Provisional application No. 62/635,886, filed on Feb. 27, 2018.

(51) Int. Cl.
    *H01L 23/367*    (2006.01)
    *H05K 7/20*    (2006.01)
    *H01R 12/51*    (2011.01)
    *H01R 33/00*    (2006.01)

(52) U.S. Cl.
    CPC ......... *H01L 23/3677* (2013.01); *H01R 12/51* (2013.01); *H01R 33/00* (2013.01); *H05K 7/20409* (2013.01); *H05K 7/2039* (2013.01)

(58) Field of Classification Search
    CPC ... H05K 7/20409; H05K 7/2039; F28F 13/00; H01L 23/367; H01L 23/3677

USPC ......... 361/704, 710, 719; 165/80.3; 257/722
See application file for complete search history.

(56) References Cited

U.S. PATENT DOCUMENTS

| 4,546,405 A | 10/1985 | Hultmark et al. |
| 4,823,869 A * | 4/1989 | Arnold ............... H01L 23/3677 165/185 |
| 4,868,638 A | 9/1989 | Hirata et al. |
| 5,008,582 A * | 4/1991 | Tanuma ............... H01L 23/467 257/E23.099 |

(Continued)

FOREIGN PATENT DOCUMENTS

EP    1686628    8/2006

OTHER PUBLICATIONS

International Search Report and Written Opinion for International (PCT) Patent Application No. PCT/US2018/063398, dated Mar. 19, 2019 13 pages.

(Continued)

*Primary Examiner* — Zachary Pape
(74) *Attorney, Agent, or Firm* — Sheridan Ross P.C.

(57) ABSTRACT

Interconnectors, interconnector assemblies, and methods for supporting components are provided. An interconnector as disclosed connects a supported component to another component or assembly securely and accurately, even where the supported component and the other component have different expansion or contraction characteristics. The interconnector includes a plurality of support elements disposed in an array. Each support element includes a support surface at a free end of the support element. The areas of the support surfaces decrease with distance from a center of the array. In a completed assembly, the free ends of the support elements in the array are joined to the supported component.

20 Claims, 14 Drawing Sheets

(56) References Cited

U.S. PATENT DOCUMENTS

| | | | |
|---|---|---|---|
| 5,886,870 A * | 3/1999 | Omori | H01L 23/4093 361/704 |
| D437,844 S | 2/2001 | Sayers et al. | |
| 6,588,497 B1 * | 7/2003 | Glezer | F15D 1/009 165/84 |
| 6,942,025 B2 * | 9/2005 | Nair | F28F 3/04 165/185 |
| 7,449,777 B2 | 11/2008 | Deboy et al. | |
| 8,534,874 B2 * | 9/2013 | Hayashi | G03B 21/16 362/294 |
| 8,581,471 B2 * | 11/2013 | Tanaka | H01L 23/467 310/328 |
| 8,928,155 B2 | 1/2015 | Kalliopuska et al. | |
| 8,964,042 B2 | 2/2015 | Nozawa et al. | |
| 9,383,145 B2 * | 7/2016 | Weber | F28D 15/0266 |
| 9,555,505 B2 * | 1/2017 | Kokubo | B21K 25/00 |
| 10,177,065 B2 | 1/2019 | Kim | |
| 10,692,769 B2 * | 6/2020 | Liang | H01L 27/0886 |
| 2005/0122689 A1 | 6/2005 | Pozzuoli | |
| 2005/0280993 A1 | 12/2005 | Campbell et al. | |
| 2008/0128896 A1 | 6/2008 | Toh et al. | |
| 2013/0344660 A1 | 12/2013 | Colgan et al. | |
| 2014/0246783 A1 | 9/2014 | Nishizawa et al. | |
| 2015/0211377 A1 | 7/2015 | Lacy et al. | |
| 2016/0035646 A1 | 2/2016 | Soyano | |
| 2016/0069622 A1 | 3/2016 | Alexou et al. | |
| 2019/0267730 A1 | 8/2019 | Ho | |

OTHER PUBLICATIONS

Official Action for U.S. Appl. No. 16/206,269, dated Jul. 10, 2019 12 pages.
Official Action for U.S. Appl. No. 16/206,269, dated Nov. 7, 2019 14 pages.
Notice of Allowance for U.S. Appl. No. 16/206,269, dated Feb. 27, 2020 9 pages.

* cited by examiner

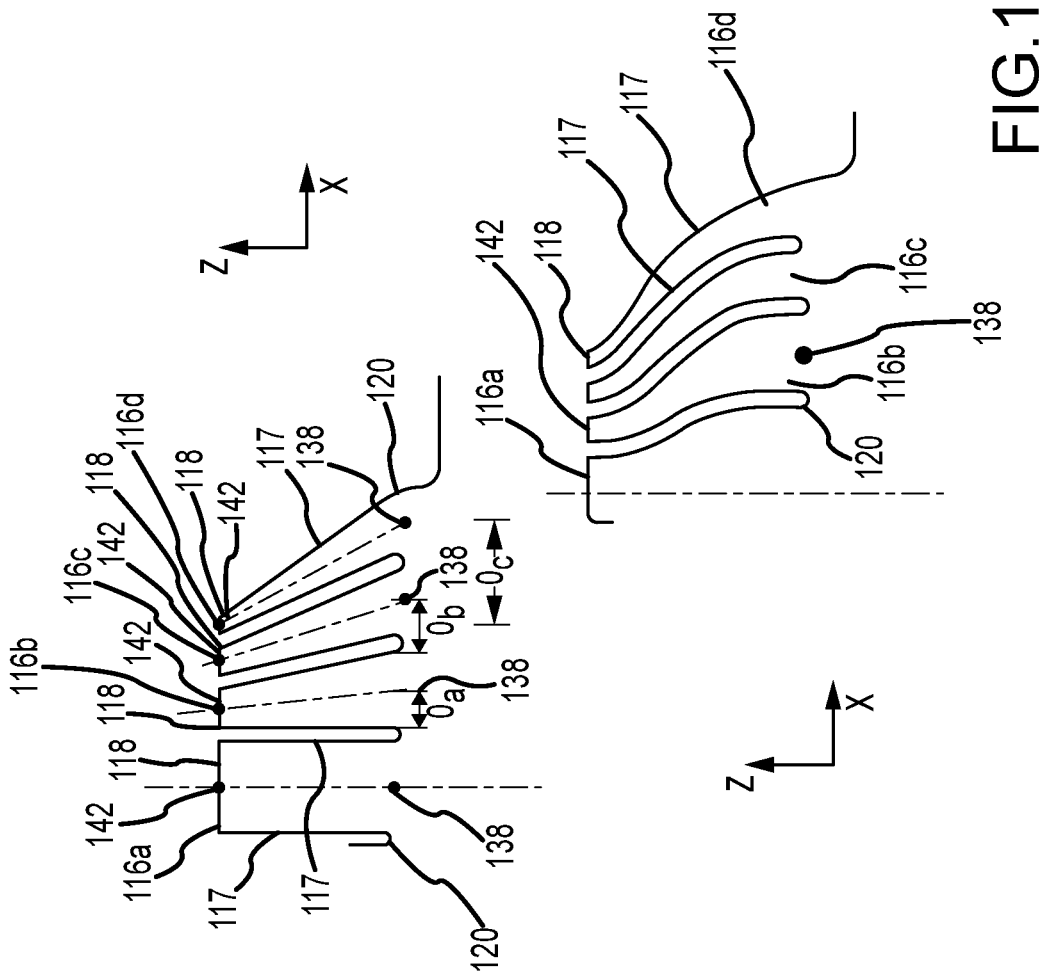

SYSTEMS AND METHODS FOR SUPPORTING A COMPONENT

CROSS REFERENCE TO RELATED APPLICATIONS

This application is a continuation-in-part of U.S. patent application Ser. No. 16/206,269, filed Nov. 30, 2018, which claims priority to and the benefit of U.S. Provisional Patent Application Ser. No. 62/635,886, filed Feb. 27, 2018, the entire disclosures of which are hereby incorporated herein by reference.

FIELD

The present disclosure provides an interconnector for supporting objects that expand or contract at different rates during operation.

BACKGROUND

The joining of components or other objects that expand or contract at different rates has long been a problem. For example, joining components having different coefficients of thermal expansion has been a problem, particularly where a secure and stable interconnection is required. For instance, detectors that are used in a variety of sensors for remote sensing and imaging applications such as star trackers using a Complementary Metal Oxide Semiconductor ("CMOS") stellar sensor or a Charged Coupled Device ("CCD") stellar sensor to provide highly accurate attitude information or to support inertial or other navigation for a host vehicle (e.g., a spacecraft) or system often need to be precisely and securely mounted. However, the semiconductor, ceramic, or other materials associated with such detectors often have a much lower coefficient of thermal expansion than the materials making up the structure around them. The interface between the materials of different coefficients of thermal expansion is often a source of mechanical hysteresis and poses difficulties to the design and manufacturing of high-performance assemblies.

Solutions for joining objects that expand or contract at different rates, such as objects having significantly different coefficients of thermal expansion, have included the use of specialized welding techniques, adhesives, compliant interconnections, and interposer devices. However, such solutions have typically been difficult to implement, prone to allowing strain to develop in connected components, incapable of providing adequate positional stability, incapable of providing a secure connection over a wide range of temperatures, do not provide adequate levels of thermal conduction, or are prone to failure.

As a particular example, solutions involving welding or adhering one component to another often result in the introduction of mechanical strain in one or both of the components as a result of the differential thermal expansion of the components, which can result in alignment errors, fatigue, and failure. The introduction of an interposer can reduce such thermally induced strain. However, the use of an interposer can increase the problem of mechanical settling. The secure joining of components having differing coefficients of thermal expansion with high precision can also require high machining and alignment tolerances in order to achieve a close fit. For example, interconnections can incorporate a shrink fit plug in one component and a hole in the other component to receive the plug. However, sufficiently high tolerances are difficult to achieve, and the adequacy of completed connections can be difficult to test. Moreover, the components can separate from one another if the mechanical tolerances are improper. In addition, after the components are joined, thermal cycling may need to be performed in order to ensure that the components have fully settled and that the connection has stabilized.

As another example, it can be difficult to connect components that experience changes in their physical dimensions through piezoelectric phenomena or the like to other components. This is a particular challenge in applications in which the component or components undergoing dimensional changes must be located with high levels of precision. For instance, when a component is used to move a mirror or other optical element in a high precision system.

Existing designs and solutions employing flexure mounting are known to provide very poor thermal conductivity through the flexure. Thermal straps can be used in combination with the mounts in order to mitigate this loss in conductivity at the expense of increased complexity and cost. Although such designs can be engineered to work over wide temperature ranges, they generally create more mechanical joints which increased the potential for hysteresis.

SUMMARY

Accordingly, there has been long-felt and unmet need to provide methods, devices and systems for joining components where the dimensions of one of the joined components changes relative to the dimensions of another of the joined components. In accordance with embodiments of the present disclosure, an interconnector is provided that enables objects having different expansion and contraction characteristics, and that therefore experience different changes in their physical dimensions, to be joined to one another securely and precisely. More particularly, embodiments of the present disclosure provide an interconnector having an array of support elements or pins. The support elements extend from a base, and have a free end that is joined to a supported component. The interconnector accommodates dimensional changes in the supported component, while maintaining a location of the supported component with a high level of precision.

Embodiments of the present disclosure provide an interconnector suitable for joining components having different expansion characteristics, including but not limited to different thermal coefficients of expansion, or components that are controlled to expand or contract relative to another component through piezoelectric or other phenomena, to one another securely and precisely. In accordance with at least some embodiments, an interconnector including a base and a support element array or pin array is provided. The array includes a plurality of support elements that extend from a first side of the base. The base of the interconnector can include a bonding surface, mount, or other provision for fixing the base to a larger assembly or platform, including but not limited to an instrument structure. A component supported by an interconnector in accordance with embodiments of the present disclosure can include a component such as but not limited to a detector package, steering mirror, telescope mirror, segment of telescope mirror, lens, other optical element, or other component that is connected to the free ends of the support elements included in the element array by an adhesive. For example, for a star tracker sensor, the stellar detector package can include a CMOS or CCD image sensor capable of forming images from visible light. In further embodiments, detector packages comprise image sensors for the same or other applications covering other parts of the electromagnetic spectrum. As can be appreciated by one of skill in the art after consideration of the present disclosure, an image sensor should be located very precisely within the associated optical assembly. As another example, the supported component can include an actuator that is operated to control the location or angle of a mirror or a lens included in an optical assembly, for instance to steer a field of view, focus an image, or otherwise control the assembly. In such an assembly, the actuator can include a piezoelectric component that operates by changing its physical dimensions in response to an applied electrical field. Therefore, by its nature, the precise locating of the actuator element and in turn of an optical or other component joined to the piezoelectric component is a challenge. Most previous methods have used assembly methods that provide good initial alignment, however the stability and longevity of that initial alignment is jeopardized through environmental conditions and other factors, and is compounded by higher part counts and increased interface joints.

In various embodiments, an element array comprises a plurality of support elements that extend from a base. The support elements included in the element array are configured to accommodate dimensional changes of a component bonded to the free ends of the support elements. Accordingly, the support elements generally feature a length, measured between a base and a free end of the element, that is greater than a dimension of the support element in a cross-section taken transverse to the length of the support element. Stability of the component relative to the base can be established by providing a relatively large number, such as 8 or more, support elements within the element array. In accordance with still other embodiments, the number of support elements within the element array can be 64 or greater. In accordance with still other embodiments of the present disclosure, the number of support elements in the element array can be 400 or greater. In accordance with the least some embodiments of the present disclosure, the support elements within the array can be arranged in rows and columns. Moreover, an area encompassed by the support element array can be the same or about the same as an area of an interconnected component.

In accordance with the least some embodiments of the present disclosure, a free end of each of the support elements is provided at a first distance from a plane defined by a surface of the base. In accordance with other embodiments of the present disclosure, a free end of most of the support elements is a first distance from a plane defined by a surface of the base, while at least three of the support elements are a second distance from the plane defined by the surface of the base, where the first distance is less than the second distance. In accordance with still further embodiments of the present disclosure, the support elements may extend from a base pedestal formed on the base. In accordance with at least some embodiments of the present disclosure, a surface of the base pedestal from which the support elements extend is planar. In accordance with other embodiments of the present disclosure, the surface of the pedestal from which the support elements extend is nonplanar. Where the surface of the pedestal is nonplanar, there may be a range of lengths of support elements in the element array, where the links of each support element is measured from an intersection of the support element with a surface of the base pedestal and the free end of the element. The length of the elements may vary based on various criteria, such as a distance of the element from a center of the element array, the location of the support element within the array relative to one or more axes configured relative to the array, or the like.

Embodiments of the present disclosure can include an array of support elements that have different dimensions from one another. For example, the cross-sectional dimensions of a support elements within an array of support elements can depend on the location of the support element within the array. In accordance with at least some embodiments of the present disclosure, the cross-sectional dimensions of a support element at or near the center of an array of support elements can be greater than the cross-sectional dimensions of a support element at or near a periphery of the array.

The support elements may be provided with bevels or other surface features. For example, an end of each support element may be beveled on some or all of the sides of the free end of the element. In accordance with still other embodiments of the present disclosure, a notch or capillary stop may be formed on some or all sides of the support element, adjacent the free end of the element. In accordance with still further embodiments, a stress relieving notch may be formed at the intersection between the support element and the surface of the base pedestal.

In accordance with embodiments of the present disclosure, an interconnector operable to join components having different expansion characteristics is provided. The interconnector comprises a base and an element array including a plurality of support elements that extend from the base and that are disposed in a plurality of rows and columns. At least some of the plurality of support elements comprise a free end provided a first distance from the base. Each support element in the plurality of support elements is spaced apart from an adjacent support element, and the element array is operable to provide a physical connection to a supported component. The supported component can experience changes in physical dimensions relative to the interconnector. For example, the physical dimensions of the supported component, but not of the interconnector, can be changed intentionally due to the application of an electrical field. As another example, due to temperature changes, the physical dimensions of the supported component can change at different rates than the physical dimensions of the interconnector, as a result of the components having different coefficients of thermal expansion. An interconnector in accordance with embodiments of the present disclosure accommodates these differences by providing mechanical compliance or flexure. In addition, an interconnector in accordance with embodiments of the present disclosure can function as a heat sink that effectively removes heat from the supported component.

In various embodiments, methods of forming and manufacturing an interconnector are provided. The method can include the steps of providing an interconnector comprising a base having an array of support elements that extend from the base. The element array can be formed by making a plurality of cuts in a first direction and a plurality of cuts in a second direction. Different support elements within the same array can be formed such that they have different dimensions. A supported element is joined to free ends of the support elements by an adhesive or other joining material. Changes in the physical dimensions of the supported element can be accommodated by flexing or bending the support elements, such that a spacing between adjacent elements changes with the changes in physical dimensions of the supported element.

Additional features and advantages of embodiments of the present disclosure will become more readily apparent from the following description, particularly when considered together with the accompanying drawings.

BRIEF DESCRIPTION OF THE DRAWINGS

FIG. 15 is an elevation view of a portion of an interconnector in accordance with other embodiments of the present disclosure;

FIG. 16 is an elevation view of a portion of an interconnector in accordance with other embodiments of the present disclosure.

DETAILED DESCRIPTION

Figure 1:
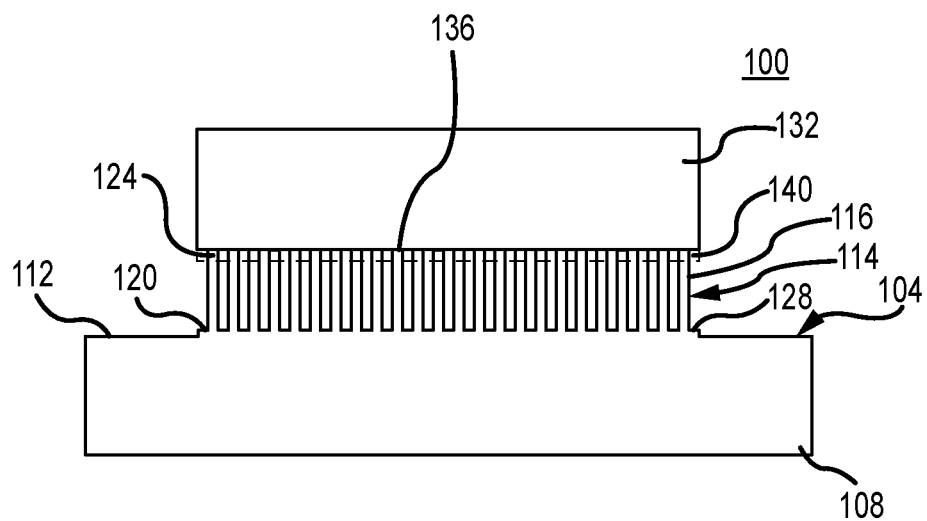
FIG. 1 is an elevation view of an assembly including an interconnector in accordance with embodiments of the present disclosure.
Figure 2:
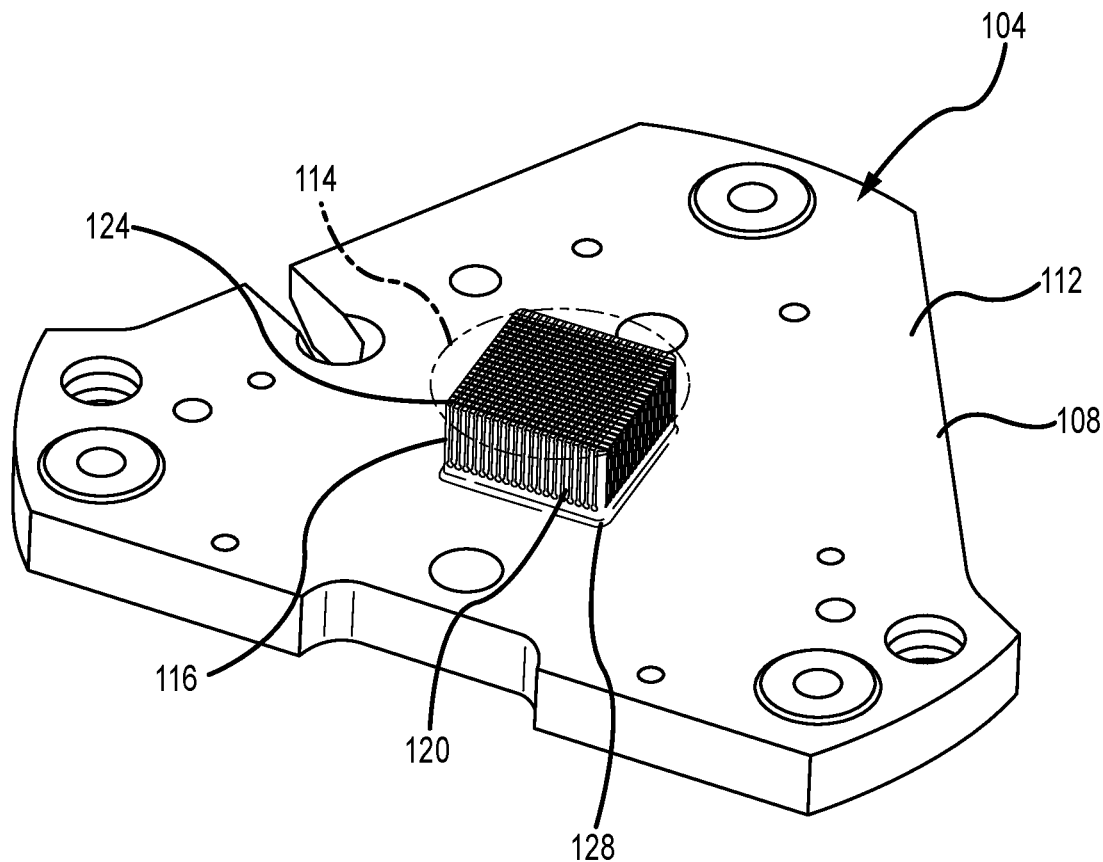
FIG. 2 is a perspective view of an interconnector in accordance with embodiments of the present disclosure.

With reference now to FIG. 1, an assembly 100 incorporating an interconnector 104 in accordance with embodiments of the present disclosure is illustrated. In particular, FIG. 1 depicts an assembly 100 in a side elevation view. FIG. 2 depicts an interconnector 104 in a top perspective view. In general, the interconnector 104 includes a base 108 with a surface 112 that defines or is intersected by a base reference plane. The interconnector 104 additionally includes an array 114 that includes a plurality of pins or support elements 116. Each support element 116 extends from the base 108 to a free end 124. In accordance with at least some embodiments of the present disclosure, the base portion 120 of each of the support elements 116 may be joined to and extend from a base pedestal portion 128. In general, the base pedestal portion 128 is raised from the surface 112 of the base 108. The base pedestal portion 128 of various embodiments, including that shown in FIG. 2, may be substantially rectangular in plan view. FIG. 2 depicts a rectilinear base pedestal in the form of a square. In alternative embodiments, the base pedestal portion 128 comprises various other geometric shapes including, but not limited to, circular, hexagonal, trapezoidal, and irregular shapes. Accordingly, no limitation is provided with respect to the shape of the base pedestal portion 128. Similarly, while various embodiments of the present disclosure contemplate support elements with a rectangular cross-section, alternative embodiments are contemplated. The support elements 116 of embodiments of the present disclosure can have various cross-sectional shapes including, but not limited to, rectangular, square, triangular, circular, and irregular cross-sectional shapes. Additionally, the shape and thickness of support elements 116 can vary along their length.

Also depicted in FIG. 1 is a supported component or assembly 132. In general, one or more of the dimensions of the supported component 132 can change relative to the dimensions of the base 108. This can be due to differences in the coefficients of thermal expansion, differences in temperature, dimensional changes imparted to one of the components due to operation of that component, or any other cause. In accordance with embodiments of the present disclosure, the supported component 132 is an electronic component. For example, the supported component 132 may comprise a detector assembly that incorporates a focal plane array, an actuator, a mirror assembly, or any other component.

Accordingly, as can be appreciated by one of skill in the art after consideration of the present disclosure, the supported component 132 may be a component that requires precise alignment stability relative to the base 108 over a wide range of operating mode or conditions. The supported component 132 may comprise a plurality of sub-components or assemblies, such as a package structure that includes a detector element such as a CMOS or CCD detector for a star tracker application. Other examples of a supported component 132 can include a steering mirror assembly, a telescope mirror, a segment of telescope mirror, a lens, some other optical element, or other component. In accordance with embodiments of the present disclosure, a bonding surface 136 of the supported component 132 is fixed to the free ends 124 of the support elements 116 by an adhesive 140. Brazing, soldering, and welding are also contemplated as alternates to using adhesive for bonding the support elements 116 to the supported component 132.

The free ends 124 of the support elements 116 are separate from one another, and the array 114 of support elements 116 accommodates changes in the dimensions of the supported component 132. In particular, changes in the dimensions of the supported component 132 along the bonding surface 136 adhered to the free ends 124 of the support elements 116 can be accommodated by movement of the free end 124 of any one support element 116 relative to the free end 124 of an adjacent support element 116. In addition, the relatively small area of adhesive 140 between the free end 124 of each support element 116 and the bonding surface 136 of the supported component 132, can improve the reliability of the joint, at least within a specified range of operating temperatures. Moreover, while the support element 116 configuration provides compliance with respect to changes in the dimensions of the bonding surface 136 of the supported component 132 in areas between adjacent support elements 116, the support element array 114 provides stability and prevents movement of the supported component 132 relative to the base 108 due to various influences, including thermal and mechanical influences.

Figure 3:
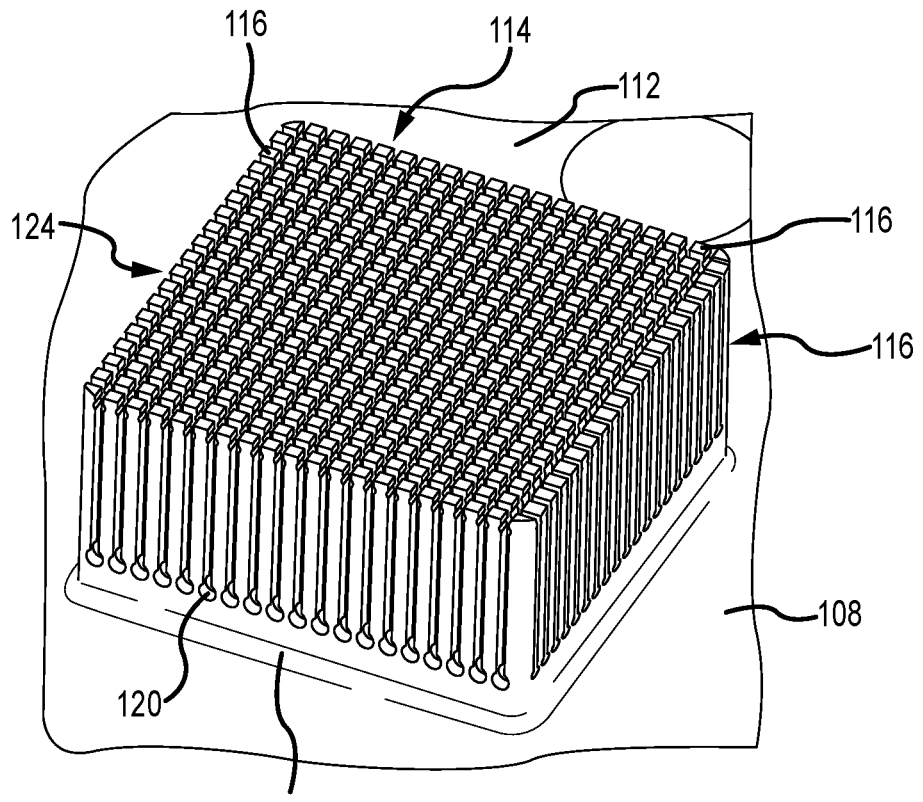
FIG. 3 is a perspective view of an interconnector in accordance with embodiments of the present disclosure.

FIG. 3 illustrates a support element array 114 in accordance with an exemplary embodiment of the present disclosure. In this example, the support element array 114 includes 400 support elements 116, arranged in a matrix of 20 rows and 20 columns. The base pedestal 128 has a planar surface underlying the support element array 114. In addition, the free end 124 of each support element 116 is a first distance from the surface of the base pedestal 128. Accordingly, each support element 116 has a length, measured from the base 120 of a subject support element 116, and adjacent to the base pedestal 128 and the free end 124 of the support element 116 that is the same.

Figure 4:
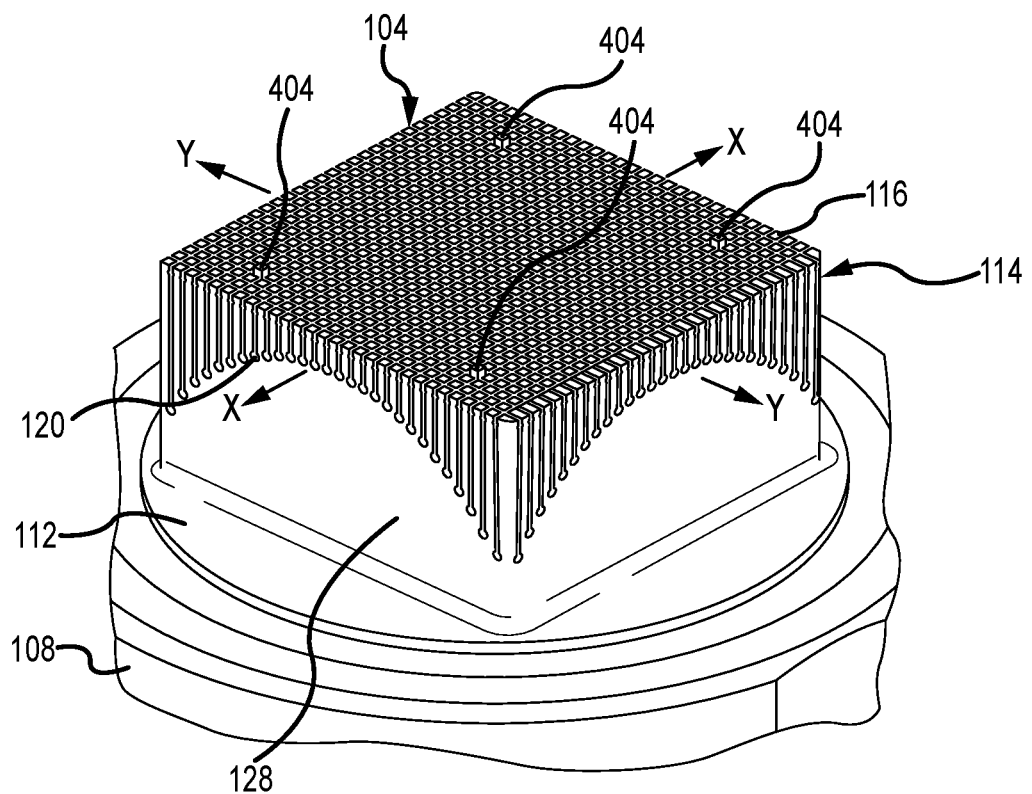
FIG. 4 is a perspective view of an interconnector in accordance with other embodiments of the present disclosure.

FIG. 4 illustrates a support element array 114 in accordance with another exemplary embodiment of the present disclosure. In this example, the support element array 116 includes 900 support elements, arranged in a matrix of 30 rows and 30 columns. The majority of the support elements 116 have a free end 124 that is a first distance from the surface 112 of the base 108, while at least some of the support elements 116, in this example 4 of the support elements, indicated by reference numeral 404 in the figure, have a free end 124 that is a second distance from the surface 112 of the base 108.

In addition, FIG. 4 illustrates an interconnector 104 with a base 108 that includes a base pedestal 128 having a curved surface underlying the support element array 114. As a result, the length of at least the support elements 116 having a free end 124 that is a first distance from the surface 112 of the base 108 can vary, depending on the location of the support element 116 within the array 114, where the length of each support element 116 is measured from the support element base 120 at a surface of the base pedestal 128 to the free end of the support element 116. For instance, the surface of the base pedestal 128 is configured such that the support elements 116 lying along two perpendicular axes, labeled X and Y in the figure, positioned at or near the center of the pedestal 128, are the shortest, while the support elements 116 at or near the corners of the array 114 are the longest. This configuration can provide support elements 116 that are more compliant with respect to thermal expansion or contraction of a connected component towards the edges of the array 114, while providing at least some relatively short, stiffer support elements 116 to ensure maintenance of precise alignment tolerances of the connected component relative to the base 108. In addition, the particular configuration illustrated in FIG. 4 facilitates fabrication of the support element array 116 using wire electrical discharge machining ("EDM") processes. In accordance with still other embodiments, other base pedestal 128 surface configurations are possible. For example, the surface of the base pedestal 128 may be generally hemispherical under the support element array 114, to provide support elements 116 that increase in length with distance from the center of the support element array 114. Such a configuration can provide increased compliance at the edges of the support element array 114, where changes in the dimensions of the bonding surface of a supported component due to thermal influences are greatest, while maintaining precise alignment of the supported component 132 relative to the base 108 by, at least in part, providing shorter, stiffer support elements 116 towards the center of the support element array 114.

As shown in various Figures, including FIG. 4, the support element array 114 includes a plurality of support elements 116 in rows and columns and with orthogonal gaps or voids extending therebetween. In alternative embodiments, the support element array 114 is rotated approximately 45 degrees from the orientation shown in FIG. 4 and relative to the base 108. In such embodiments, cuts or voids between the support elements 116 extend diagonally across the base 108 of the device.

Figure 5:
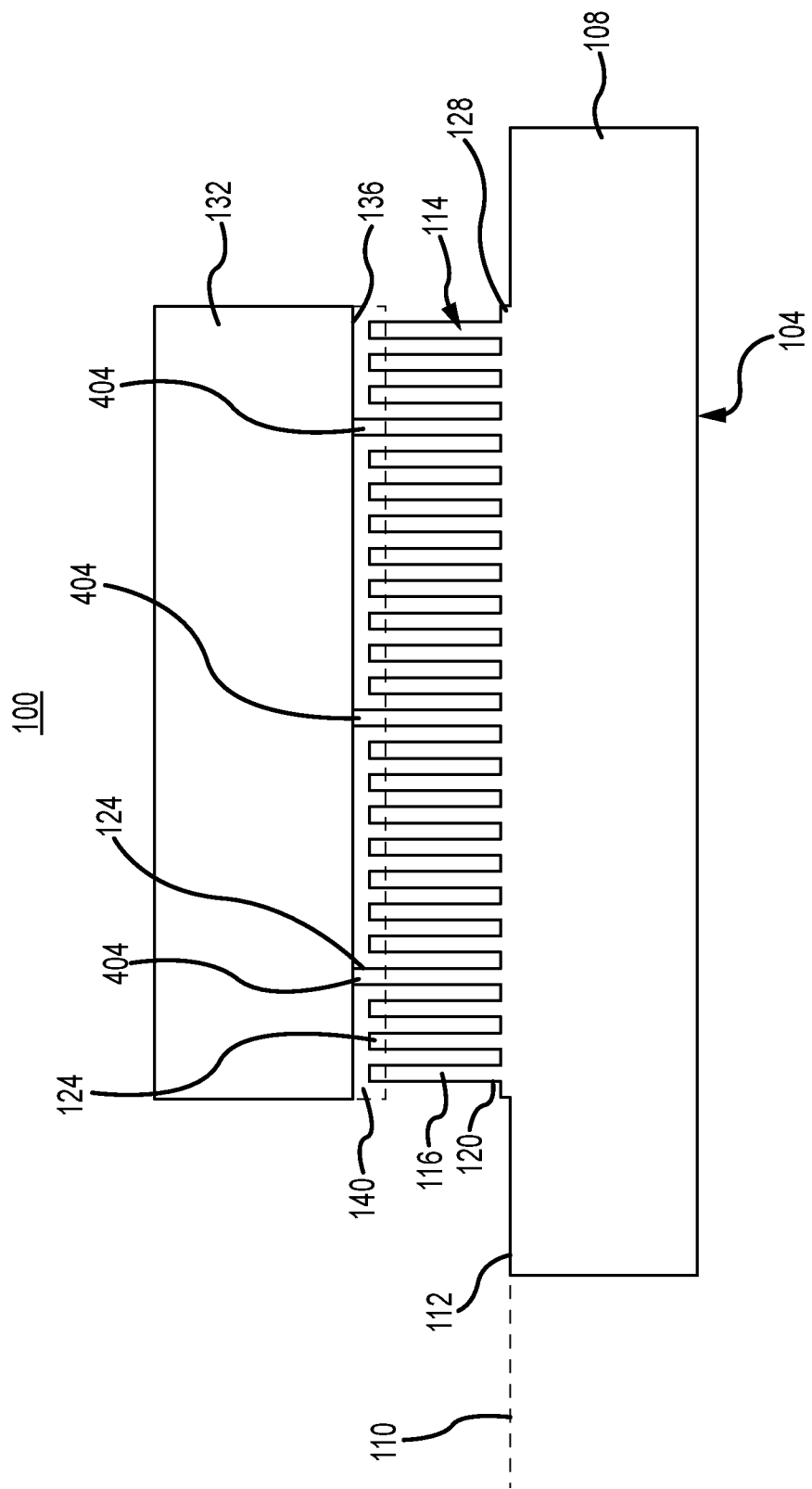
FIG. 5 is an elevation view of an assembly including an interconnector in accordance with other embodiments of the present disclosure.

FIG. 5 depicts an assembly 100 incorporating an interconnector 104 in accordance with further embodiments of the present disclosure in a side elevation view. More particularly, and as shown in the embodiment of FIG. 5, a support element array 114 includes a majority of support elements 116 with a free end 124 that is a first distance from a plane 110 extending through or parallel to a first surface 112 of the base 108, and at least some support elements 404 with a free end 124 that is a second, farther distance from that plane 110 relative to the first set of support elements 116. Moreover, as depicted in FIG. 5, the free ends 124 of the support elements 404 that extend farther from the reference plane are in contact with the bonding surface 136 of the supported component 132. The free ends of the majority of the support elements 116 (i.e. the support elements with a free end that is a first distance from the reference plane) are spaced apart from and connected to the bonding surface 136 of the supported component 132 by a thin layer of the adhesive 140. As can be appreciated by one of skill in the art after consideration of the present disclosure, when the supported component 132 is placed in contact with the support elements 404 that extend farther from the base 108 reference plane, a spacing or gap of a predetermined size is maintained between the bonding surface 136 and the free ends 124 of the majority of the support elements 116. As can also be appreciated, such a gap can facilitate the secure bonding of the supported component 132 by the adhesive 140. In this example, three support elements 404 extend farther from the reference plane than the majority of the support elements 116. However, it should be appreciated that the number of longer support elements 404 can be any number equal to three or greater, in order to achieve the described positioning and spacing advantages.

Figure 6:
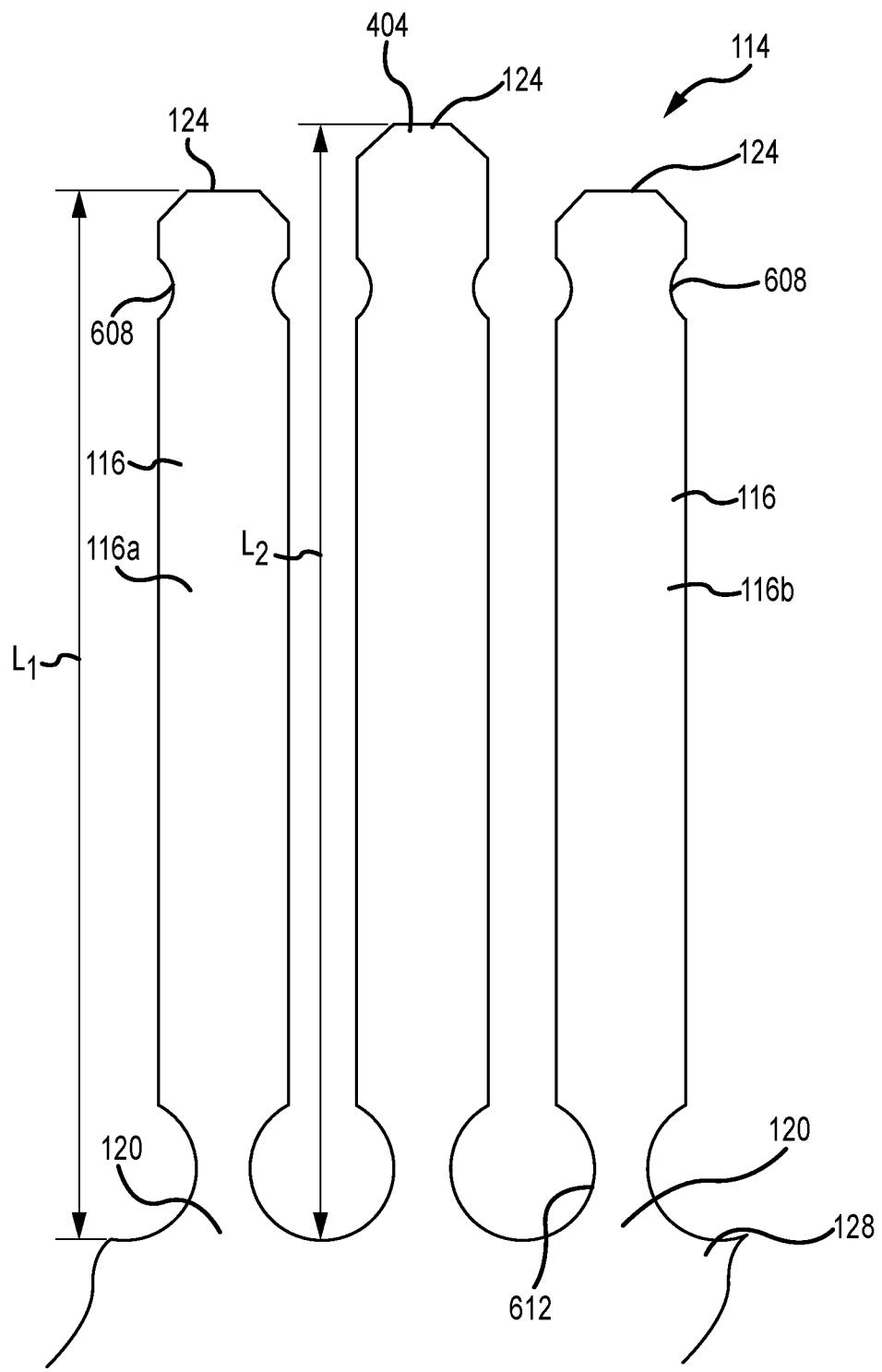
FIG. 6 is an elevation view of details of support elements included in a support element array of an interconnector in accordance with embodiments of the present disclosure.

With reference now to FIG. 6, a detail of a support element array 114, and in particular an illustration of a number of support elements 116 included in an interconnector 104 in accordance with embodiments of the present disclosure are depicted in a side elevation view. The support elements 116 include two support elements, labeled 116a and 116b having a first length ($L_1$), where the length is measured from an intersection of the base portion 120 of the support element 116 and the base pedestal 128, and the free end 124 of the support element 116. A third support element 404 is provided that comprises a second length ($L_2$). In this exemplary embodiment, each of the support elements 116, 404 feature a capillary stop 608 towards the free end 124. In general, the capillary stop 608 is in the form of a notch, groove, or other depression formed in some or all of the edges of the respective support element 116, 404. The capillary stops 608 assist in maintaining an adhesive layer 140 towards the free end 124 of the support elements 116, 404. In addition, the figure illustrates the inclusion of a stress relief or compliance feature 612 at the base 120 of the support elements 116, 404. The compliance feature 612 comprises a necked portion of reduced support element thickness proximal to the base of the support elements. The compliance features 612 enable enhanced flexure of the support elements, and provide for a stress concentration feature proximal to the base 128.

In various embodiments, and as shown in FIGS. 1-6 (for example), an interconnector 104 is provided that comprises a base 108 and a support element array 114 including a plurality of support elements 116 that extend from the base 108. At least some of the plurality of support elements 116 comprising a free end 124 provided a first distance from the base 108, and wherein each of the plurality of support elements 116 are spaced apart.

In one embodiment, at least three 404 of the plurality of support elements of the interconnector 104 each have a free end 124 that is a second distance from the base 108, and wherein the second distance is greater than the first distance. It is contemplated that the length of each of the at least three support elements 404 is the same, and a length of each of the remainder of the support elements 116, measured from a base of each of the remainder of the support elements to the free end of the remainder of the support elements, is the same.

In some embodiments, a length of at least a first support element 116 located proximal to a center of the support element array 114 is less than a length of at least a second support element 404 that, relative to the first support element 116, is located proximal to an edge of the support element array 114.

The interconnectors of the present disclosure can include a base pedestal 128, wherein the base pedestal 128 is formed on the base 108, and wherein the support elements 116, 404 extend from the base pedestal 128, and wherein a surface of the base pedestal 128 is non-planar. In certain embodiments, a surface of the base pedestal is curved or convex.

In various embodiments, interconnectors comprise a base 108 and support elements 116, 404 that are formed from a single piece of thermally conductive material (e.g. aluminum).

In at least some embodiments, an interconnector assembly is provided that comprises an interconnector 104 with a base 108 and a support element array 114. The support element array 114 comprises a plurality of support elements 116, 404 extending from the base 108. A first assembly 700 is connected to the interconnector 104 and is in contact with at least some of the plurality of support elements 116, 404. An adhesive 140 is provided in contact with the first assembly 700 and a free end 124 of at least some of the plurality of support elements 116, 404.

In some embodiments, the interconnector assembly comprises a detector assembly. More specifically, in certain embodiments, the interconnector assembly comprises a Complementary Metal Oxide Semiconductor device. In further embodiments, the first assembly comprises a Charged Coupled device.

In some embodiments, the interconnector assembly comprises a base 108 and a support element array 114 that are formed from a single piece of thermally conductive material, such as aluminum.

In various embodiments, interconnectors and connected devices are provided that comprise a thermoelectric cooler for managing heat in the assembly.

Figure 7A:
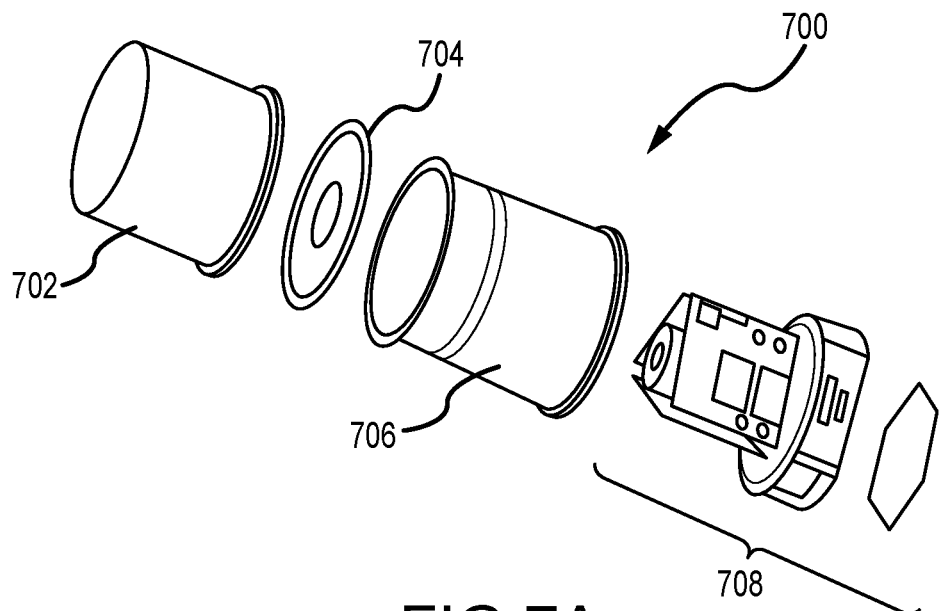
FIG. 7A is an exploded perspective view of an imaging device with an interconnector according to embodiments of the present disclosure.
Figure 7B:
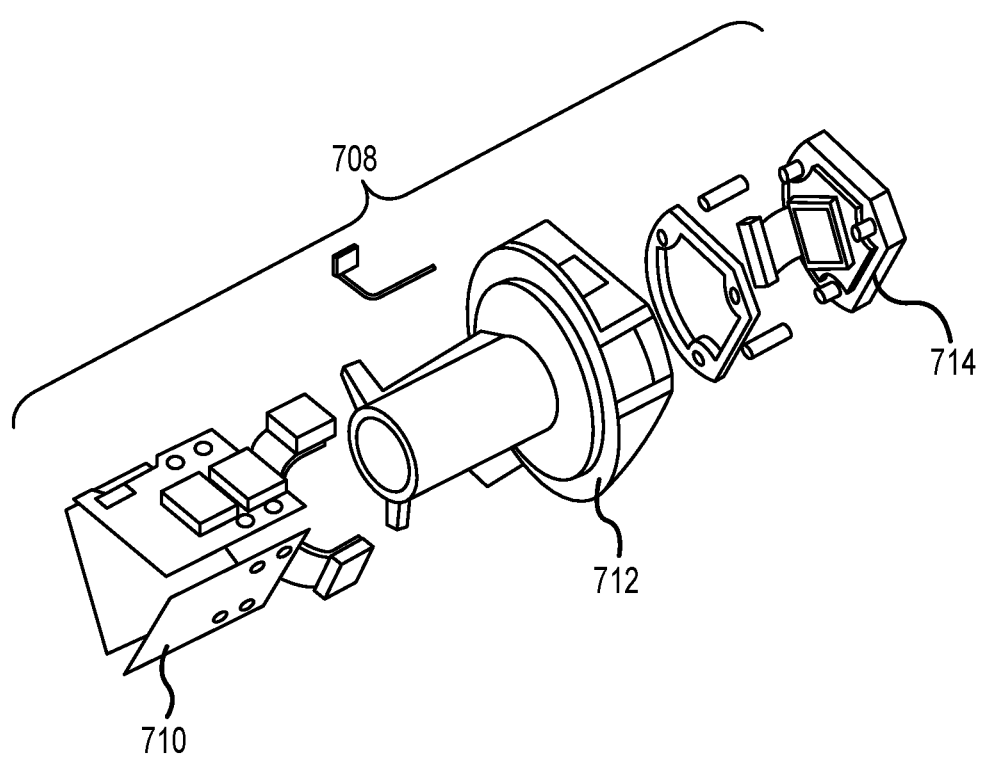
FIG. 7B is an exploded perspective view of a detector core of an imaging device with an interconnector according to embodiments of the present disclosure.

FIGS. 7A-7B are exploded perspective views of a detector assembly 700 comprising a focal plane assembly according to embodiments of the present disclosure. The detector may comprise a star tracker assembly. As shown in FIG. 7A, the detector assembly 700 comprises a light shade 702, a baffle 704, and a radiation shield 706. A detector core 708 is provided that comprises an optical subassembly, processor electronics, and a focal plane assembly 714. FIG. 7B is an exploded perspective view of the detector core 708, showing the focal plane assembly 714 and interconnected components. Specifically, and as shown in FIG. 7B, the processor electronics 710, an optical subassembly 712, and the focal plane assembly 714 are interconnectable. The detector core 708 in this example comprises a stellar focal plane array that comprises at least one of a CMOS device and a CCD device. In various embodiments, the detector assembly 700 comprises a thermoelectric cooler for managing heat in the assembly. The thermoelectric cooler is contemplated as comprising various devices using the Peltier effect such as a solid state active heat pump, for example.

Figure 8:
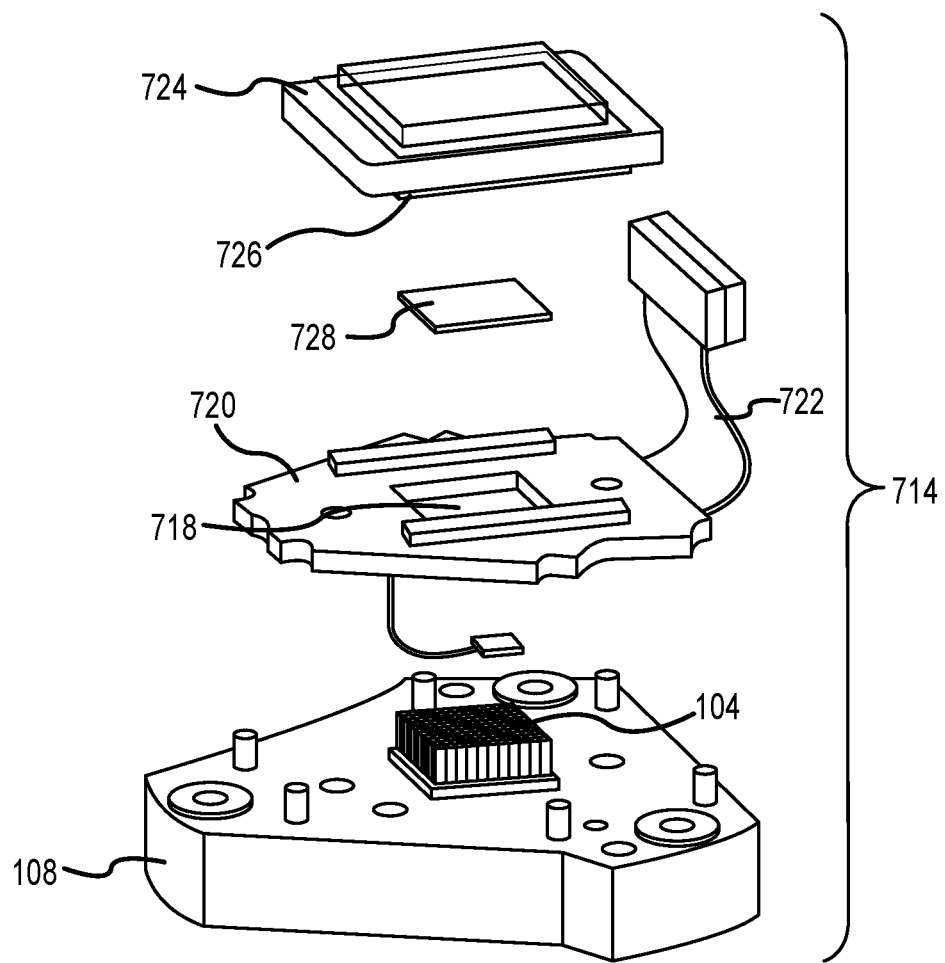
FIG. 8 is an exploded perspective view of a focal plane assembly comprising an interconnector in accordance with embodiments of the present disclosure.

FIG. 8 is an exploded perspective view of the focal plane assembly 714 shown in FIGS. 7A-7B. As shown in FIG. 8, the focal plane assembly 714 comprises a base 108 with an interconnector 104 provided thereon and wherein the interconnector 104 comprises a plurality of support elements as shown and described with respect to various embodiments herein. A circuit or control board 718 is provided and comprises an aperture 720 that is operable to receive the interconnector 104. The control board 718 comprises passive electronics that provide drive circuitry, and further comprises a hardwire connection 722 to connect to and communicate with various additional components of the assembly 710. A CMOS component 724 is provided that preferably comprises digital command and control and which is capable of providing full frame video at 10 Hertz. The CMOS component 724 comprises a pin connection 726 that is operable to connect to and communicate with the interconnector 104 of the base 108. In some embodiments, the pin connection 726 and the interconnector 104 are at least partially connected by an adhesive layer 728.

In various embodiments, the base 108 comprises a platform to accommodate the components shown and described herein and provides a conductive thermal path for heat dissipation from features of the detector assembly 700 and the detector and processor assembly 708.

In various embodiments, methods of manufacturing a detector assembly are provided. In one embodiment, a method is provided that comprises forming an interconnector 104 comprising a base 108, providing a support element array 114 on the base 108 by forming a plurality of support elements 116, 404 by making a plurality of cuts or voids in a first direction and a plurality of cuts or voids in a second direction. At least some of the plurality of support elements 116 comprise a free end 124 on an opposing end of the support element 116 relative to the base 108. Each of the plurality of support elements are spaced apart from an adjacent support element. A detector assembly 700 comprising a lens, a processor, and at least one of a Complementary Metal Oxide Semiconductor device and a Charged Coupled device is provided, and an adhesive or joining material 140 is provided in contact with a free end 124 of at least some of the support elements 116, 404. At least a portion of the detector assembly 700 is secured to the support element array 114 via the adhesive 140.

In some embodiments, methods of the present disclosure further comprise a step of forming a capillary stop 608 in at least one of the plurality of support elements 116, 404.

In some embodiments, methods of the present disclosure comprise forming cuts or voids wherein the first direction and the second direction are orthogonal to one another.

In various embodiments, methods are provided wherein the plurality of support elements comprises a first set of support elements 116, wherein the free end 124 of each of the support elements in the first set of support elements 116 is a first distance from a plane 110 of the base 108. A second set of support elements 404 is provided, wherein the free end of each of the support elements in the second set of support elements 404 is a second distance from a plane 110 of the base 108. In various embodiments, at least some of the support elements 116, 404 comprise a rectilinear cross section. In some embodiments, methods of the present disclosure are provided wherein the base and the support elements are formed from a single piece of thermally conductive material.

Figure 9:
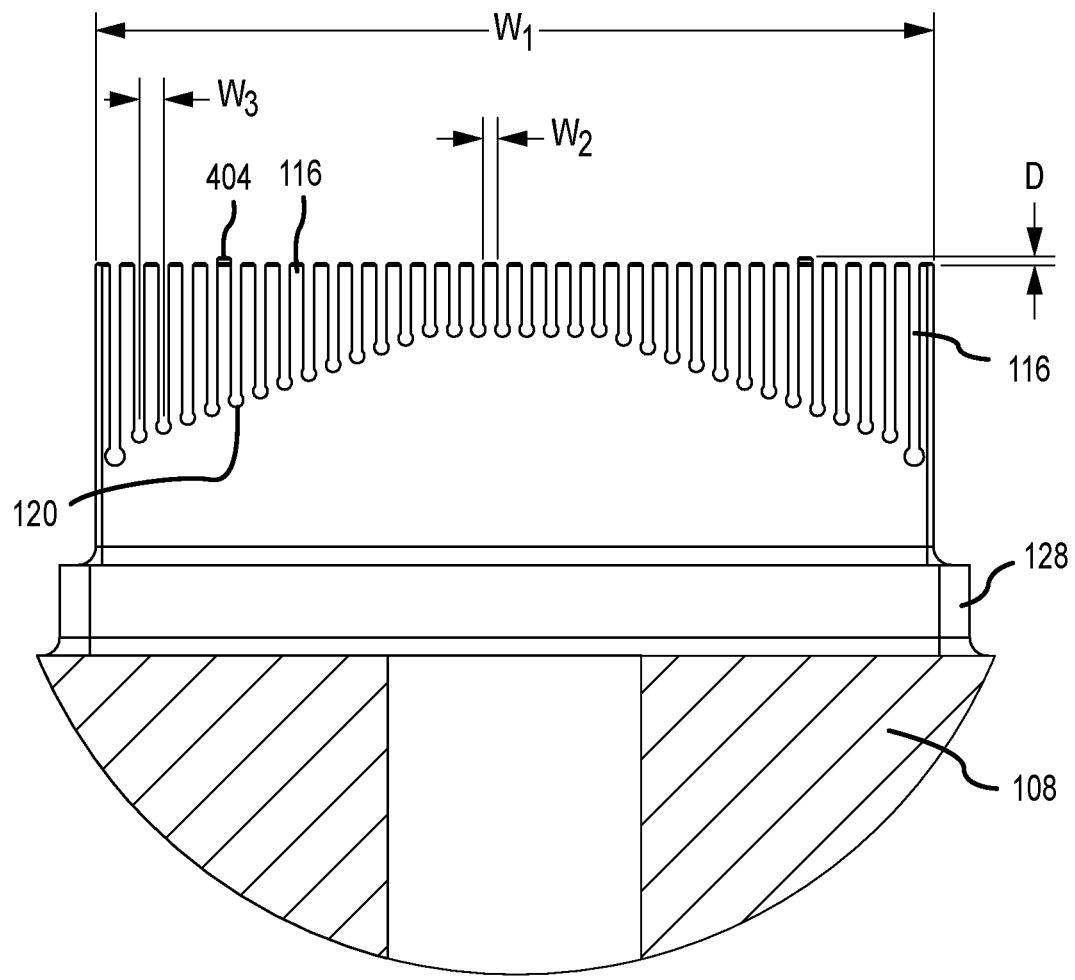
FIG. 9 is a cross-sectional elevation view of an interconnector according to one embodiment of the present disclosure.

FIG. 9 is a cross-sectional elevation view of an interconnector 114 according to one embodiment of the present disclosure. As shown, the interconnector 114 comprises a plurality of support elements 116, 404 extending upwardly from a base pedestal portion 128 provided on a base 108. The interconnector 114 comprises support elements of at least two different lengths, with a first set of support elements 116 being shorter than at least one secondary support element 404. The differential D between the first set of support elements 116 and the at least one secondary support element 404 comprises a distance of between approximately 0.0020 inches and 0.010 inches, and more preferably of about 0.003 and 0.007 inches.

The support elements of the interconnector 114 comprise a total width $W_1$ that is between approximately 0.250 inches and 1.50 inches, and more preferably of between about 0.50 inches and 1.0 inches. In some embodiments, it is contemplated that the total width $W_1$ is between 0.60 inches and 0.80 inches, and preferably of about 0.694 inches. In various embodiments, the support elements are provided in a square pattern.

The support elements 116, 404 comprise a width $W_2$ that is between approximately 0.0050 inches and 0.050 inches, and more preferably of between about 0.010 inches and 0.020 inches. In some embodiments, it is contemplated that the support element width $W_2$ is between 0.010 inches and 0.0150 inches. In accordance with further embodiments the support element width is about 0.012 inches.

A distance between the center of gaps or slots between support elements comprises a width $W_3$ that is between approximately 0.0050 inches and 0.050 inches, and more preferably of between about 0.010 inches and 0.030 inches. In some embodiments, it is contemplated that the width $W_3$ is approximately 0.020 inches.

As shown in the cross-section of FIG. 9, the support elements 116 are distributed across a base pedestal 128 that describes a substantially frustoconical surface or form. A first set of support elements 116 is therefore comprised of a plurality of support elements that have different heights between their base and their free end. However, each of the free ends of the first set of support elements 116 terminates at approximately the same distance from the base 108. The secondary support elements 404 are shown as having the same length with their base 120 and free ends provided in the same plane, respectively. In alternative embodiments, however, it is contemplated that the secondary support elements comprise a different total length with free ends that terminate in the same plane, similar to the first set of support elements 116 shown in FIG. 9.

Figure 10B:
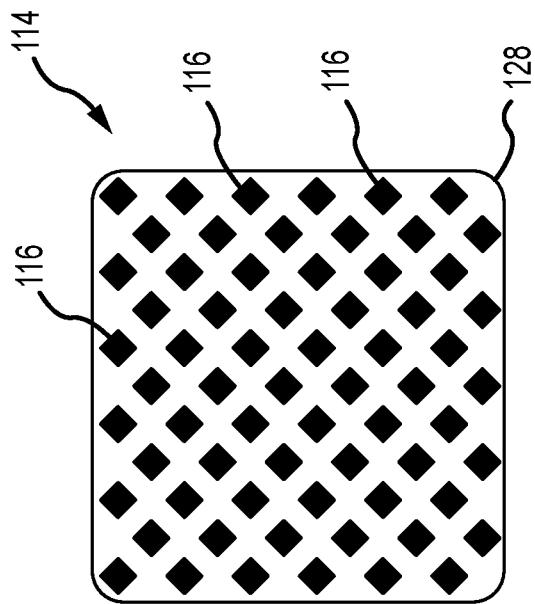
FIG. 10B is a detailed top plan view of the interconnector according to the embodiment of FIG. 10A.
Figure 10A:
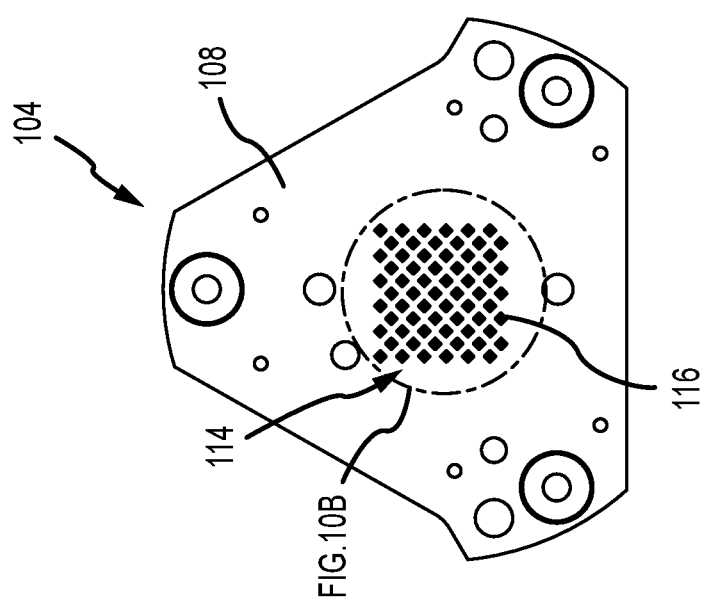
FIG. 10A is a top plan view of an interconnector according to one embodiment of the present disclosure.

FIG. 10A is a top plan view of an interconnector 104 comprising a base and a support element array 114. As shown, the support element array 114 comprises a plurality of support elements 116 that are oriented differently from the embodiment shown in FIG. 2, for example. The cuts or void spaces between support elements 116 comprise diagonal cuts that form a plurality of rows and a plurality of columns. FIG. 10B is a detailed plan view of the support element array 114 of FIG. 10A. As shown, the support elements 116 comprise a rectilinear cross-section formed in part by a plurality of orthogonal cuts. The support elements 116 preferably extend upwardly from a base pedestal portion 128 provided on the base 108. The support elements 116 of FIGS. 10A-10B may comprise support elements that all extend to the same height above the base 108. Alternatively, and as shown and described herein, the support elements 116 of FIGS. 10A-10B may comprise at least three support elements of a different height above the base 108 from a remainder of the support elements 116.

Although various examples of an interconnection have been described in connection with securing a supported component comprising an imaging, sensing, or tracking detector such as a CMOS or CCD detector for a star tracker application or other electronic package or device to a second assembly or component, embodiments of the present disclosure are not so limited. For example, an interconnector as described herein can be used to secure any supported component having a first coefficient of thermal expansion to any second component having a second coefficient of thermal expansion securely, and while maintaining a high degree of stability in positional accuracy between the components. In accordance with the least some embodiments of the present disclosure, the interconnector can comprise a monolithic structure formed from a single or integral piece of material. In accordance with further embodiments of the present disclosure, the interconnector can be formed from a thermally conductive material. Examples of suitable materials include aluminum.

Figure 11:
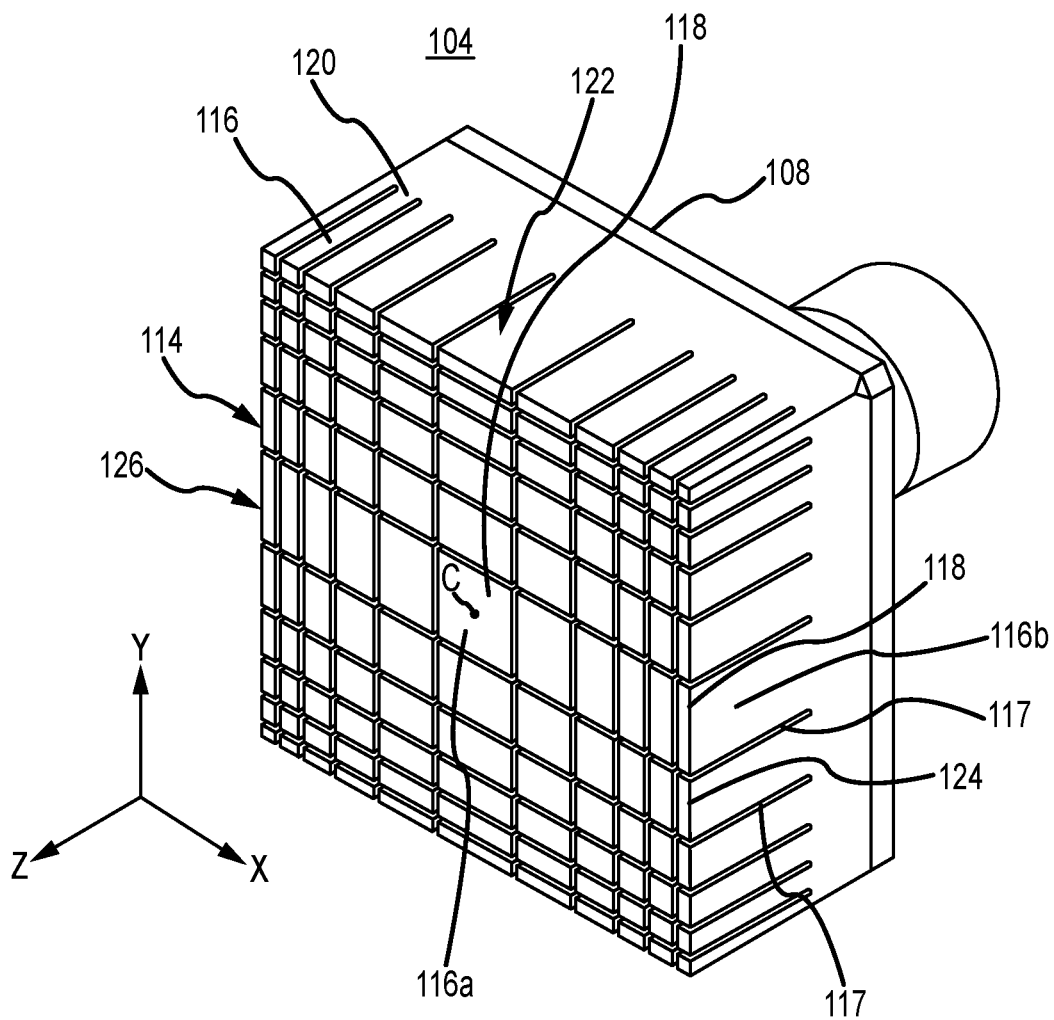
FIG. 11 is a perspective view of an interconnector in accordance with other embodiments of the present disclosure.
Figure 12:
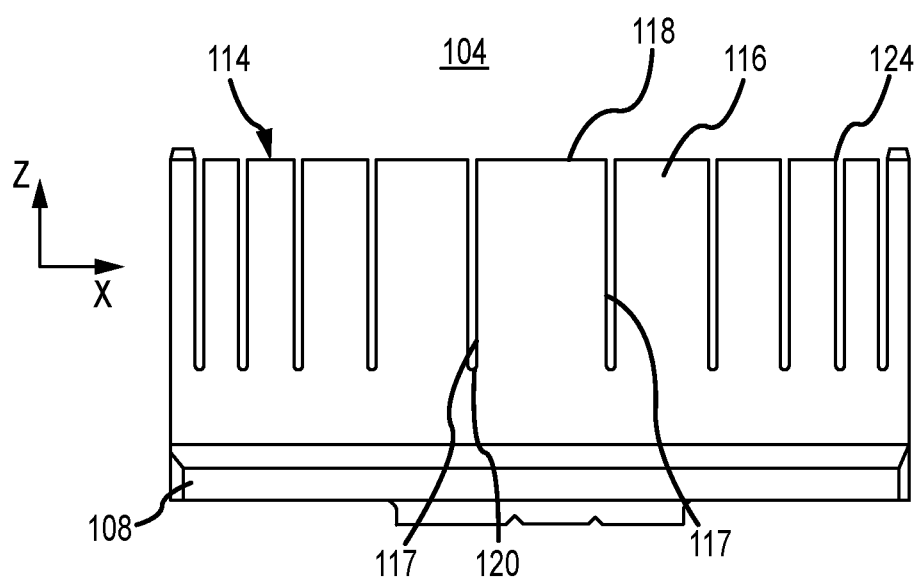
FIG. 12 is an elevation view of the interconnector of FIG. 11.
Figure 13:
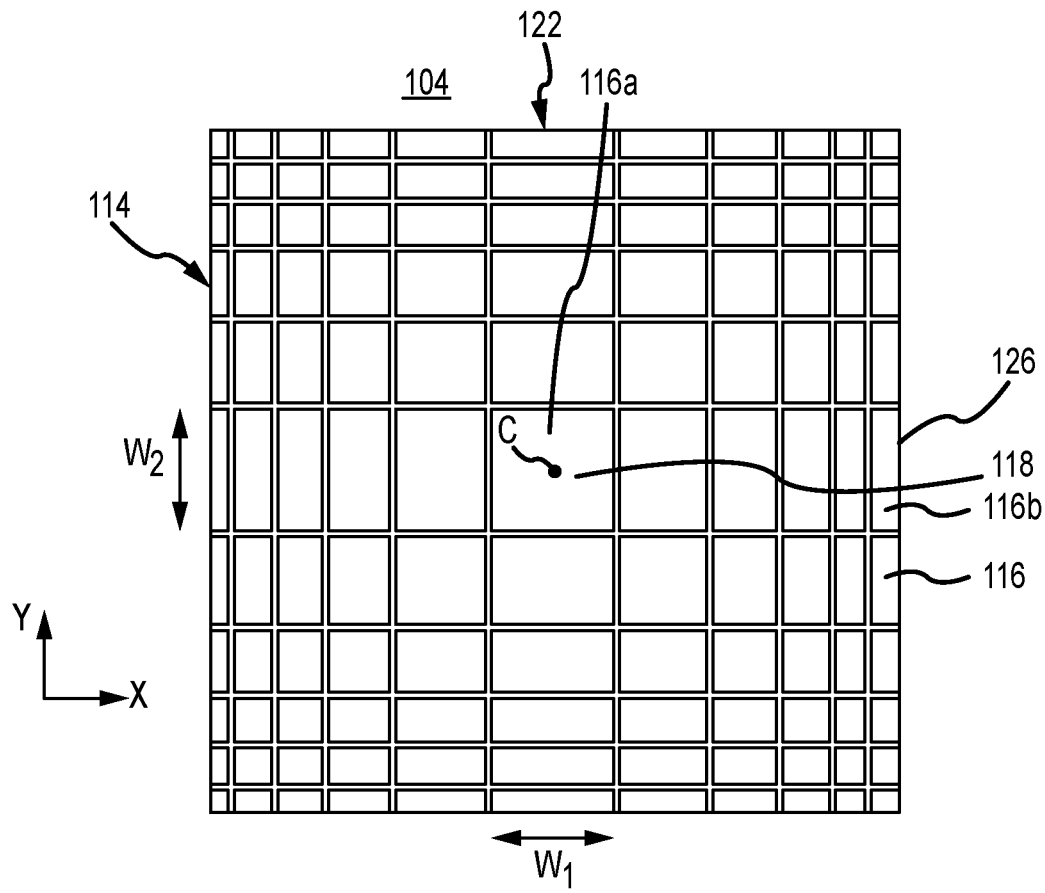
FIG. 13 is a top plan view of the interconnector of FIG. 11.

With reference now to FIGS. 11-13, an interconnector 104 in accordance with other embodiments of the present disclosure is illustrated in top perspective, side elevation, and top plan views respectively. In the illustrated example, the interconnector 104 includes a base portion 108 from which a plurality of support elements 116 extend. The support elements 116 are disposed in an array 114 having a plurality of rows and columns.

As best shown in FIG. 13, an area of the end or support surfaces 118 at the free end 124 of each of the support elements 116 can vary based on the location of the support element 116 within the array 114. In particular, a support element 116 at or proximate to the center C of the array 114 (e.g. support element 116a) will have a support surface 118 area that is greater than the support surface 118 area of a support element at or proximate to the perimeter of the array 114 (e.g. support element 116b). Moreover, the support surface 118 areas of the support elements can decrease with distance from the center C of the array 114. Accordingly, in the example of FIG. 13, the support element 116a at the center of the array 114 has a support surface 118 with an area that is greater than the area of the support surfaces 118 of any of the other support elements 116. In this example the support surfaces 118 of the support elements 116 in the same column 122 of support elements 116 as the center support element 116a maintain a constant dimension W1 along the X-axis, and have a dimension W2 along the Y-axis (i.e. along the column direction) that gets smaller with distance from the center support element 116a. Also in this example, the support surfaces 118 of the support elements 116 in the same row 126 of support elements 116 as the center support element 116a maintain a constant dimension W2 along the Y-axis, and have a dimension W1 along the X-axis (i.e. along the row direction) that gets smaller with distance from the center support element 116a. Support elements 116 along lines extending diagonally from the center support element 116a can have W1 and W2 dimensions that both decrease at the same rate with distance from the center support element 116a. Accordingly, where an area of the support surface 118 of the center support element 116a is square, the areas of the support surfaces 118 of the support elements 116 along lines extending diagonally from the center support element 116a can also be square. In accordance with at least some embodiments of the present disclosure, at least some of the support elements 116 have the same dimensions as one another. In addition, instead of having a support element 116 at a center of the array 114, a plurality of support elements 116 can be placed about the center C of the array 114. In such an embodiment, at least two of the support elements immediately adjacent the center of the array 114 can have the same width dimensions as one another. Whether or not the array 114 includes a center support element 116, the width dimensions of the support elements can decrease with distance from the center C of the array 114. In accordance with at least some embodiments of the present disclosure, the dimension or dimensions of a support surface 118 of a support element 116 decreases with distance from the center support element 116a, where there is one, or from the center C of the array 114, by a factor of √2.

Figure 14A:
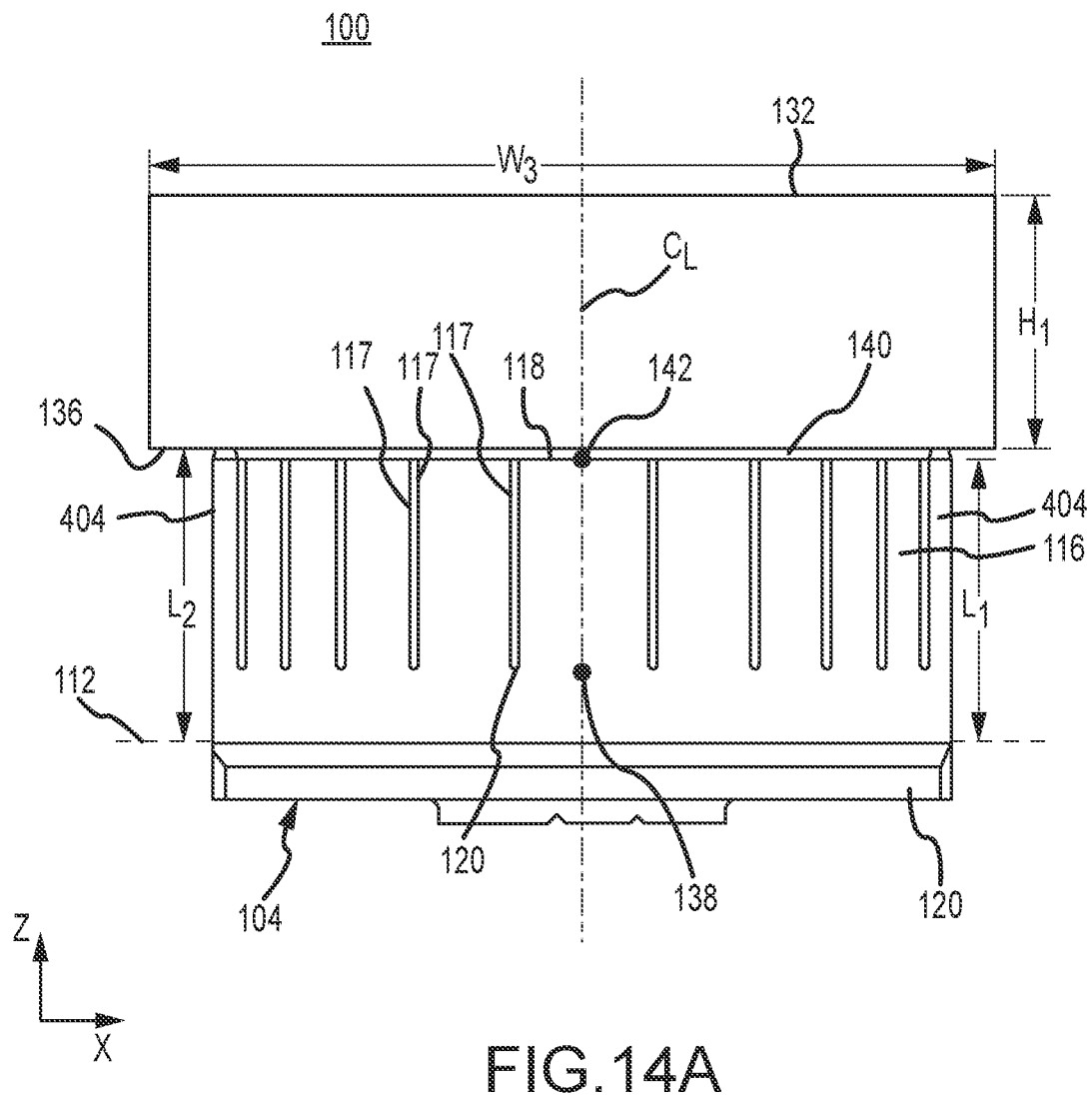
FIGS. 14A and 14B are views in elevation of the interconnector of FIG. 11, joined to a supported component.
Figure 14B:
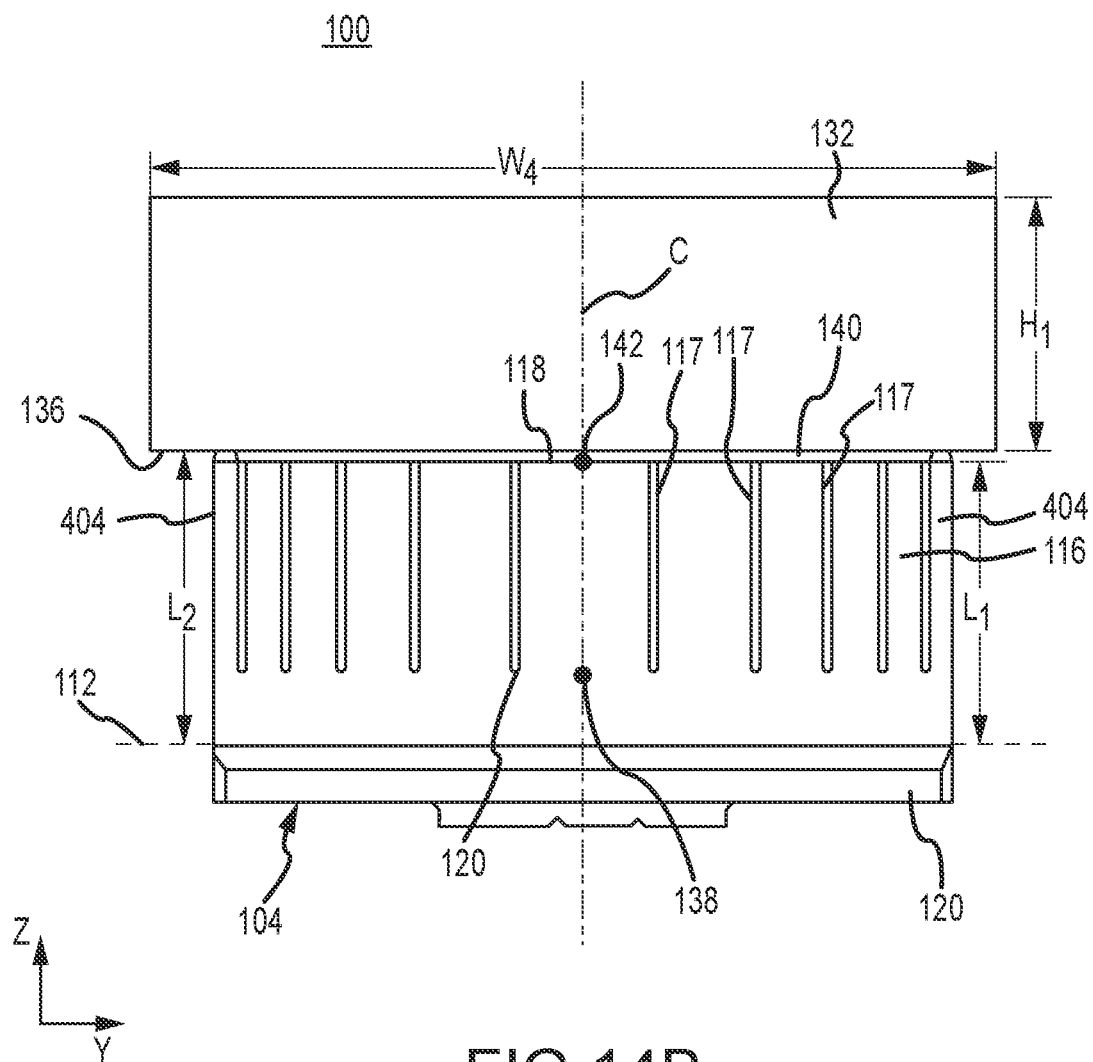

FIG. 14A depicts an assembly 100 that includes an interconnector 104 in accordance with embodiments of the present disclosure, joined to a supported component 132 by an adhesive 140 from a perspective taken along the Y-axis. FIG. 14B depicts the same assembly 100 as in FIG. 14A, but from a perspective that is taken along the X-axis. In accordance with at least some embodiments of the present disclosure, the supported element 132 can undergo dimensional changes over time. These changes in the dimensions of the supported component 132 can be independent of or different than dimensional changes that may be experienced by the base 120. The array 114 of support elements 116 allows such changes in the dimensions of the supported component 132 to be accommodated. Moreover, such changes in the dimensions of the supported component 132 can be accommodated while maintaining a location of the supported element 132 within the assembly 100 with high levels of precision.

More particularly, where the supported component 132 is a piezoelectric element, the dimensions of the supported component 132 can be changed by applying an electrical field to that component 132. For example, by applying an electrical field having certain characteristics, the height H1 of the supported component 132 can be increased, while the widths W3 and W4 of the supported component 132 are decreased. This in turn introduces a stress to the interconnector 104. The configuration of the interconnector 104 support elements 116 provided by elements of the present disclosure accommodate the changes in the dimensions of the supported component 132, by providing free ends 124 that can move relative to one another and to the base 120. Moreover, this is accomplished while maintaining a desired positioning of the supported component 132 relative to the interconnector 104 and other components of the larger assembly 100. For example, a center line $C_L$ of the supported component 132 can be maintained in a position that is centered over the center support element 116a.

In accordance with embodiments of the present disclosure, the center support element 116a has a larger width (W1 and W2) dimensions than other support elements 116, because dimensional compliance at the center of the supported component 132 is not required. The relatively large width dimensions of the center support element 116a result in a support element 116 that is relatively stiff. The relatively large width dimensions of the center support element 116a also results in a relatively large support surface or support surface 118 area. This has the advantages of securely locating the center of the supported component 132 in the X-Y directions, providing good support. The relatively large support surface 118 area also provides good thermal conductivity. As distance from the center support element 116a decreases, support elements 116 in accordance with embodiments of the present disclosure decrease in at least the width dimension that is parallel to the axis along which the distance from the center support element 116a is increasing. As can be appreciated by one of skill in the art after consideration of the present disclosure, the change in dimensions of the supported component 132 due to a piezoelectric, thermal, or other effect will generally increase with distance from the center C. Accordingly, increasing levels of compliance or elasticity in the support elements 116 is provided at locations along the bonding surface 136 of the supported component 132 where such increased compliance is desired.

As shown in the example embodiment of FIGS. 14A and 14B, a distance from a reference plane 112 through the base 120 to the support surface 118 at the free end 124 of at least most of the support elements 116 is equal to L1. In addition, a distance from the reference plane 112 to the support surface 118 of at least some of the support elements 404 is equal to L2, where L2 is greater than L1. For example, the support elements 116 at the corners of the array 114 can have a support surface 118 that is at a distance L2 from the reference plane. This configuration allows the supported component 132 to be in direct contact with the support surfaces 118 of the support elements 404, while maintaining a spacing between the supported component 132 and the support surfaces 118 of most of the support elements 116. This in turn facilitates the creation of a strong adhesive 140 bond between those support elements 116 and the bonding surface 136 of the supported component 132. Also in this example embodiment, the sidewalls 117 of the support elements 116 are parallel to one another and to the sidewalls 117 of the other support elements 116. In addition, for each support element 116, a center point 142 of the support surface 118 is aligned with a center point 138 of the base portion 120 along a line that is parallel to the Z axis.

Although various embodiments have been shown and described that feature support elements 116 having parallel sidewalls 117 that are uniform or substantially uniform along their length (e.g. uniform expect for a capillary stop 608, a compliance feature 612, and/or a taper at the free end 124), other configurations are possible. For example, as shown in FIG. 15, at least some of the support elements 132 can taper along their length from a relatively wide base towards a relatively narrow free end 124. The taper can be asymmetrical. Moreover, the sidewall 117 of a support element 116 can be parallel to the facing sidewall 117 of an adjacent support element 116. In addition, some or all of the support elements 132 can have a support surface 118 with a center point 142 that is offset from a center point 138 of a base portion 120 of the support element by an offset amount O. In such a configuration, a line 130 passing through the center point 138 of the base portion and through a center point 142 of the support surface 118 of some of those support elements is not parallel to a line orthogonal to a base reference plane 112 (i.e. is not aligned along the Z-axis direction). Moreover, different support elements 132 can have different tapers and different offsets. For example, as depicted in FIG. 15, the center support element 116a can have parallel sidewalls 117, a support surface 118 area that is equal to the base portion 120 area, and no offset. A support element 116b adjacent the center support element 116a can have sidewalls 117 that are not parallel to one another, forming a taper, and defining a base portion 120 area that is greater than a support surface 118 area. The support element 116b can also have a support surface 118 center point 142 that is offset by amount $O_a$ relative to a base portion 120 center point 138. With distance from the center support element 116a, the support surface 118 areas and base portion 120 areas of the support elements 116 can decrease. In addition, an offset amount can increase with distance from the center support element 116a. Accordingly, the offset amount can increase from zero for the center support element 116a, to a second amount $O_a$ for the support element 116b adjacent the center support element 116a, to a third amount $O_b$ for the next support element 116c, and to a fourth amount $O_c$ for the final support element 116d.

FIG. 16 depicts a partial array 114 of support elements 112 in accordance with still other embodiments of the present disclosure. In this embodiment, the sidewalls 117 are curved. In addition, for each support element 116, the support surface 118 area is less than the base portion 120 area 120. Moreover, for each support element not at the center of the array, a center of the support surface 118 area can be offset relative to the center 138 of the base portion 120 area.

Figure 17:
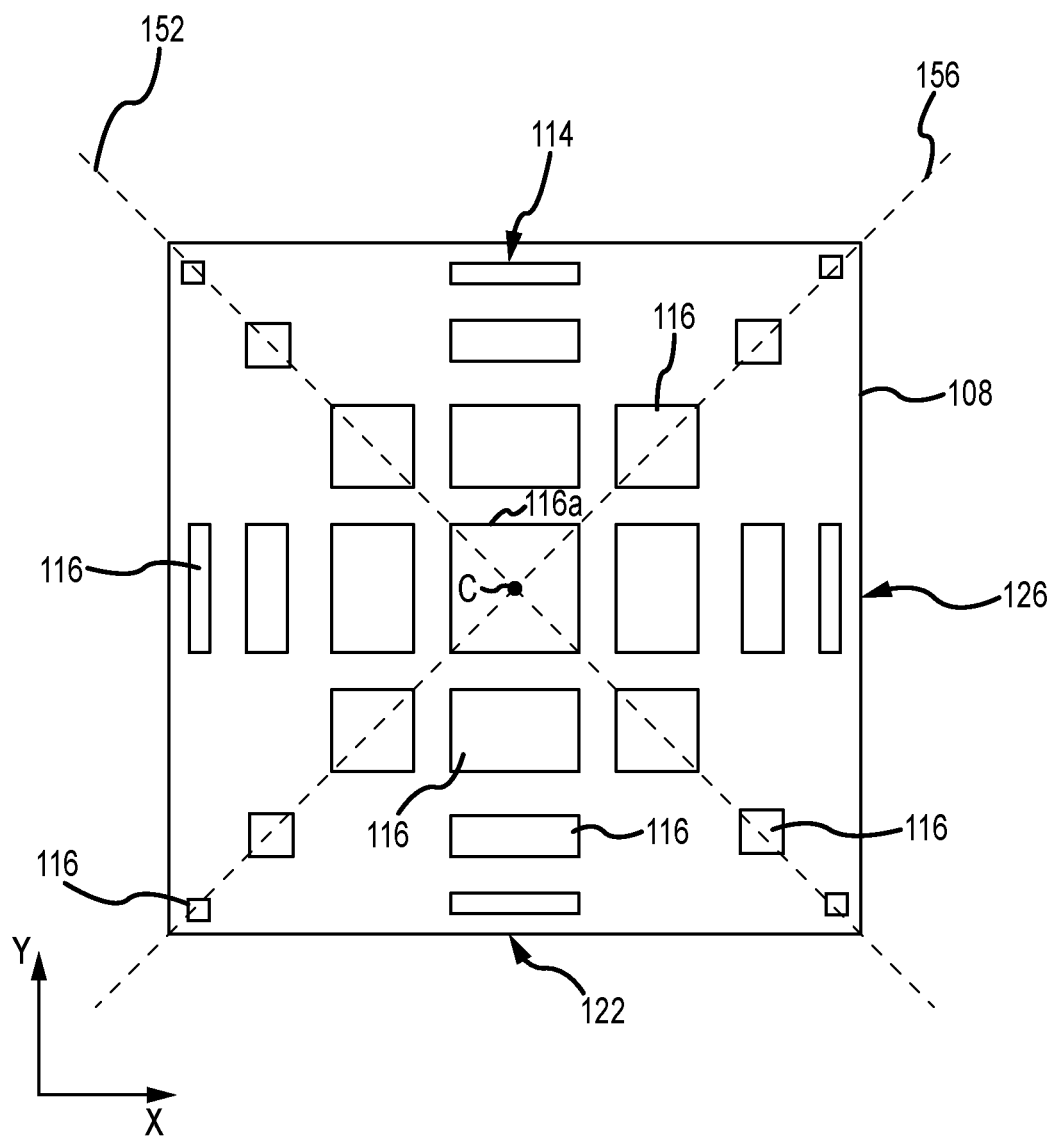
FIG. 17 is a top plan view of an interconnector in accordance with other embodiments of the present disclosure.

In various illustrated and described embodiments, the support elements 116 are separated by uniform gaps or cuts. Although such configurations provide advantages such as accommodating dimensional changes in the supported component 132, providing good support for the supported component, and providing good thermal conductivity, other configurations are possible. For instance, a sparse array 114 of support elements 116 can be provided. An example of such a configuration is depicted in plan view in FIG. 17. In this example, support elements 116 are only disposed in the same column 122, same row 126, a first diagonal axis 152, and a second diagonal axis 156 intersecting the center point C of the array 114. In accordance with still other embodiments, a center point C of an array 114 need not coincide with a support surface 118 of a support element 116. For instance, support elements having the same support surface 118 area can surround the center point C of the array 114.

In accordance with embodiments of the present disclosure, the interconnector 104 is formed from a single piece of material. The material can be thermally conductive, to promote the removal of heat from the supported component 132. The material can also be elastic or compliant. Examples of suitable materials include metals or thermally conductive composites. The support elements 116 can be formed using etching, electrical discharge machining, or cutting processes. In accordance with other embodiments, the support elements 116 can be formed using additive processes.

The foregoing discussion has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. An interconnector, comprising:
a base;
a plurality of support elements, each of the support elements including:
a base portion proximate to the base; and
a support surface distal from the base;
wherein the plurality of support elements includes at least first and second support elements wherein the first support element is at or a first distance from a center of the plurality of support elements and has a support surface area that is greater than a support second distance from the center of the plurality of support elements, wherein the support elements in the plurality of support elements are disposed within an array of support elements, wherein the support elements in the array of support elements are disposed in rows and columns, wherein the first support element and the second support element are in a same row, and wherein a dimension of the support surface area of the first support element along a row direction is greater than a dimension of the support surface area of the second support element along the row direction.

2. The interconnector of claim 1, wherein a dimension of the support surface area of the first support element along the column direction is equal to a dimension of the support surface area of the second support element along the column direction.

3. The interconnector of claim 2, wherein the plurality of support elements further includes a third support element, wherein the first support element and the third support element are in a same column, wherein the dimension of the support surface area of the first support element along the column direction is greater than a dimension of a support surface area of the third support element along the column direction.

4. The interconnector of claim 3, wherein the dimension of the support surface area of the first support element along the row direction is equal to a dimension of the support surface area of the third support element along the row direction.

5. The interconnector of claim 4, wherein the plurality of support elements further includes a fourth support element, wherein the first support element and the fourth support element are in a same column, wherein the dimension of the support surface area of the first support element along the column direction is greater than a dimension of a support surface area of the fourth support element along the column direction.

6. The interconnector of claim 5, wherein the third support element is in a row on a first side of the first support element, wherein the fourth support element is in another row on a second side of the first support element, and wherein the support surface area of the third support element is equal to a support surface area of the fourth support element.

7. The interconnector of claim 6, wherein the plurality of support elements further includes a fifth support element, wherein the first support element and the fifth support element are in a same row, wherein the dimension of the support surface area of the first support element along the row direction is greater than a dimension of a support surface area of the fifth support element along the row direction.

8. The interconnector of claim 7, wherein the second support element is in a column on a third side of the first support element, wherein the fifth support element is in another column on a fourth side of the first support element, and wherein the support surface area of the second support element is equal to a support surface area of the fifth support element.

9. The interconnector of claim 1, wherein the support surface area of the first support element is square, and wherein the support surface area of the second support element is rectangular.

10. The interconnector of claim 9, wherein a center of the support surface area of the first support element coincides with the center of the plurality of support elements.

11. An assembly, comprising:
a supported component;
an interconnector, including:
  a base;
  a plurality of support elements extending from the base and disposed in an array, wherein each support element includes a support surface at a free end distal from the base, wherein a first support element proximate to a center of the array has a support surface area that is greater than an area of a second support element proximate to a perimeter of the array, wherein the free ends of the first and second support elements are joined to the supported component, wherein the support elements in the array are disposed in rows and columns, wherein the first support element and the second support element are in a same row, and wherein a dimension of the support surface area of the first support element along a row direction is greater than a dimension of the support surface area of the second support element along the row direction.

12. The assembly of claim 11, wherein the supported component is a piezoelectric component.

13. The assembly of claim 11, wherein the supported component changes dimensions relative to the interconnector.

14. The assembly of claim 11, wherein the supported component is joined to the interconnector by an adhesive.

15. The assembly of claim 11, wherein the interconnector is formed as an integral component formed from a single piece of metal.

16. A method for supporting a component, comprising:
forming an array of support elements, wherein each of the support elements includes a base portion extending from a base and a free end, wherein a support surface is formed at the free end of each of the support elements, wherein an area of the support surface is greater for a first support element proximate to a center of the array than for a second support element proximate to the periphery of the array, wherein the support elements in the array are disposed in rows and columns, wherein the first support element and the second support element are in a same row, and wherein a dimension of the support surface area of the first support element along a row direction is greater than a dimension of the support surface area of the second support element along the row direction; and
interconnecting a component to the free ends of the support elements.

17. The method of claim 16, further comprising:
changing a dimension of the component in a direction corresponding to the row direction of the array of support elements by applying an electrical field to the component, wherein as a result of changing the dimension of the component a distance between free ends of adjacent support elements in the same row is changed.

18. The method of claim 17, wherein the component is a piezoelectric component.

19. The method of claim 16, wherein interconnecting a component to the free ends of the support elements includes adhering the component to the free ends of the support elements.

20. The method of claim 16, wherein the array of support elements is formed from a single piece of metal.

* * * * *

UNITED STATES PATENT AND TRADEMARK OFFICE
CERTIFICATE OF CORRECTION

PATENT NO. : 11,094,605 B2
APPLICATION NO. : 16/844217
DATED : August 17, 2021
INVENTOR(S) : Joseph Hsing-Hwa Ho Page 1 of 1

It is certified that error appears in the above-identified patent and that said Letters Patent is hereby corrected as shown below:

In the Claims

In Claim 1, Column 16, Line 9, after "elements" and before "wherein", please insert --,--;

In Claim 1, Column 16, Line 12, after "support" and before "second", please insert --surface area of the second support element, wherein the second support element is a--.

Signed and Sealed this
Twenty-sixth Day of October, 2021

Drew Hirshfeld
*Performing the Functions and Duties of the
Under Secretary of Commerce for Intellectual Property and
Director of the United States Patent and Trademark Office*